United States Patent
Kim et al.

(10) Patent No.: US 8,860,303 B2
(45) Date of Patent: Oct. 14, 2014

(54) ORGANIC LIGHT-EMITTING DISPLAY DEVICE AND METHOD OF MANUFACTURING THE SAME

(75) Inventors: Ji-Young Kim, Seoul (KR); Jin-Goo Kang, Suwon-si (KR); Jae-Bok Kim, Hwaseong-si (KR); Hyo-Seok Kim, Seoul (KR)

(73) Assignee: Samsung Display Co., Ltd., Yongin (KR)

( * ) Notice: Subject to any disclaimer, the term of this patent is extended or adjusted under 35 U.S.C. 154(b) by 161 days.

(21) Appl. No.: 13/323,706

(22) Filed: Dec. 12, 2011

(65) Prior Publication Data

US 2012/0169217 A1    Jul. 5, 2012

(30) Foreign Application Priority Data

Jan. 3, 2011 (KR) .................. 10-2011-0000269

(51) Int. Cl.
H01J 1/62 (2006.01)
H01J 63/04 (2006.01)
H01L 27/32 (2006.01)
H01L 51/52 (2006.01)

(52) U.S. Cl.
CPC ......... *H01L 27/3246* (2013.01); *H01L 27/3258* (2013.01); *H01L 51/5237* (2013.01)
USPC ............................ 313/506; 313/504; 313/512

(58) Field of Classification Search
CPC ............ H01L 27/3246; H01L 51/5237; H01L 27/3258
USPC .......................................... 313/504, 506, 512
See application file for complete search history.

(56) References Cited

U.S. PATENT DOCUMENTS

| | | | | |
|---|---|---|---|---|
| 7,728,510 B2 * | 6/2010 | Oh | ................................. | 313/504 |
| 8,203,264 B2 * | 6/2012 | Kang et al. | ..................... | 313/505 |
| 8,221,177 B2 * | 7/2012 | Iwakura et al. | .................. | 445/24 |
| 2004/0113550 A1 * | 6/2004 | Adachi et al. | .................. | 313/512 |
| 2004/0263072 A1 * | 12/2004 | Park et al. | ....................... | 313/509 |
| 2005/0206309 A1 * | 9/2005 | Shibasaki et al. | .............. | 313/504 |
| 2006/0113900 A1 * | 6/2006 | Oh | ................................. | 313/504 |
| 2006/0125390 A1 * | 6/2006 | Oh | ................................. | 313/506 |
| 2007/0132365 A1 * | 6/2007 | Kang et al. | ..................... | 313/500 |
| 2008/0203906 A1 * | 8/2008 | Iwakura et al. | ............... | 313/504 |
| 2009/0200931 A1 * | 8/2009 | Takei et al. | .................... | 313/504 |

FOREIGN PATENT DOCUMENTS

| | | |
|---|---|---|
| KR | 10-2005-0013853 A | 2/2005 |
| KR | 10-2006-0018768 A | 3/2006 |
| KR | 10-2006-0080302 A | 7/2006 |
| KR | 10-0805596 B1 | 2/2008 |

* cited by examiner

*Primary Examiner* — Thomas A Hollweg
(74) *Attorney, Agent, or Firm* — Knobbe Martens Olson & Bear LLP

(57) ABSTRACT

The organic light-emitting display device includes: a substrate including a transistor region; and a thin-film transistor formed over the transistor region of the substrate and having a planarization film which is disposed over a source/drain electrode and a pixel defining layer which includes an aperture exposing a portion of a first electrode electrically connected to the source/drain electrode and defining a pixel region, wherein an outgassing hole is formed in a region of the pixel defining layer other than the aperture to expose the planarization film.

7 Claims, 8 Drawing Sheets

ORGANIC LIGHT-EMITTING DISPLAY DEVICE AND METHOD OF MANUFACTURING THE SAME

This application claims priority from Korean Patent Application No. 10-2011-0000269 filed on Jan. 3, 2011 in the Korean Intellectual Property Office, the disclosure of which is incorporated herein by reference in its entirety.

BACKGROUND

1. Field

The present disclosure relates to an organic light-emitting display device and a method of manufacturing the same, and more particularly, to an organic light-emitting display device which is not damaged by outgassing generated in a planarization film.

2. Description of the Related Technology

The rapid development of the information and technology (IT) industry is dramatically increasing the use of display devices. Recently, there have been demands for display devices that are lightweight and thin, consume low power and provide high resolution. To meet these demands, liquid crystal displays or organic light-emitting displays using organic light-emitting characteristics are being developed.

Organic light-emitting displays, which are next-generation display devices having self light-emitting characteristic, have better characteristics than liquid crystal displays in terms of viewing angle, contrast, response speed and power consumption, and can be manufactured to be thin and lightweight since a backlight is not required.

An organic light-emitting display includes a substrate having a display region and a non-display region and a container or another substrate which is placed to face the substrate for encapsulation and attached to the substrate by a sealant such as epoxy. In the display region of the substrate, a plurality of organic light-emitting diodes (OLEDs) are connected in a matrix pattern between scan lines and data lines to form pixels. In the non-display region, the scan lines and the data lines extending from the scan lines and the data lines of the display region, power source supply lines for operating the OLEDs, and a scan driver and a data driver for processing signals received from an external source via input pads and providing the processed signals to the scan lines and the data lines are formed.

An organic light-emitting display is manufactured by forming a semiconductor layer, a gate electrode and a source/drain electrode on a substrate, forming a planarization film on the resultant structure to planarize the substrate, forming a pixel defining layer, which defines a pixel region, on the planarization film, and forming an organic light-emitting layer on the pixel defining layer.

The organic light-emitting layer may be formed using a nozzle printing method. In the nozzle printing method, a micro nozzle forms an organic light-emitting layer by spraying an organic light-emitting material as it passes over a pixel region. After nozzle printing, a baking process is performed. Here, the baking process may be performed several times.

During the baking process, outgassing may be generated in the planarization film that is made of an organic material. However, since the pixel defining layer made of an inorganic material is disposed on the planarization film, the outgassing cannot be released from the planarization film. The trapped outgassing may inflate inside the planarization film or may deform the planarization film, thereby deforming the pixel defining layer and an electrode. The deformed pixel defining layer and the deformed electrode may cause defects.

SUMMARY

Aspects of the present invention provide an organic light-emitting display device, in which the deformation of a planarization film and a pixel defining layer is avoided by releasing outgassing generated in a planarization film during a baking process that accompanies a nozzle printing process from the planarization film and which has a low defect rate caused by outgassing, and a method of manufacturing the organic light-emitting display device.

However, aspects of the present invention are not restricted to the one set forth herein. The above and other aspects of the present invention will become more apparent to one of ordinary skill in the art to which the present invention pertains by referencing the detailed description given below.

According to an aspect of the present invention, there is provided an organic light-emitting display device including: a substrate including a transistor region; and a thin-film transistor formed on the transistor region of the substrate and having a planarization film which is disposed on a source/drain electrode and a pixel defining layer which includes an aperture exposing a portion of a first electrode electrically connected to the source/drain electrode and defining a pixel region, wherein an outgassing hole is formed in a region of the pixel defining layer other than the aperture to expose the planarization film.

According to another aspect of the present invention, there is provided an organic light-emitting display device including: a substrate including a transistor region; and a thin-film transistor formed on the transistor region of the substrate and having a planarization film which is disposed on a source/drain electrode and a pixel defining layer which includes an aperture exposing a portion of a first electrode electrically connected to the source/drain electrode and defining a pixel region, wherein an outgassing hole is formed in a region of the pixel defining layer other than the aperture to expose the planarization film, and an organic passivation film is formed on the outgassing hole to cover edges of the outgassing hole.

According to another aspect of the present invention, there is provided a method of manufacturing an organic light-emitting display device. The method includes: forming a planarization film on a transistor region of a substrate; forming a first electrode, which is electrically connected to a source/drain electrode, on the planarization film; providing a pixel defining layer which includes an aperture exposing a portion of the first electrode to define the pixel region; forming an outgassing hole in a region of the pixel defining layer other than the aperture to expose the planarization film; and forming an organic light-emitting layer on the first electrode of the pixel region by using a nozzle printing process, wherein outgassing generated by the planarization film in the forming of the organic light-emitting layer is released from the planarization film through the outgassing hole.

According to another aspect of the present invention, there is provided a method of manufacturing an organic light-emitting display device. The method includes: forming a planarization film on a transistor region of a substrate; forming a first electrode, which is electrically connected to a source/drain electrode, on the planarization film; providing a pixel defining layer which includes an aperture exposing a portion of the first electrode to define the pixel region; forming an outgassing hole in a region of the pixel defining layer other than the aperture to expose the planarization film; forming an organic passivation film on the outgassing hole to cover edges of the outgassing hole; and forming an organic light-emitting layer on the first electrode of the pixel region by using a nozzle printing process, wherein outgassing generated by the planarization film in the forming of the organic light-emitting layer is released from the planarization film through the organic passivation film and the outgassing hole.

BRIEF DESCRIPTION OF THE DRAWINGS

The above and other aspects and features of the present invention will become more apparent by describing in detail embodiments thereof with reference to the attached drawings, in which.

DETAILED DESCRIPTION OF EMBODIMENTS

Figure 1:
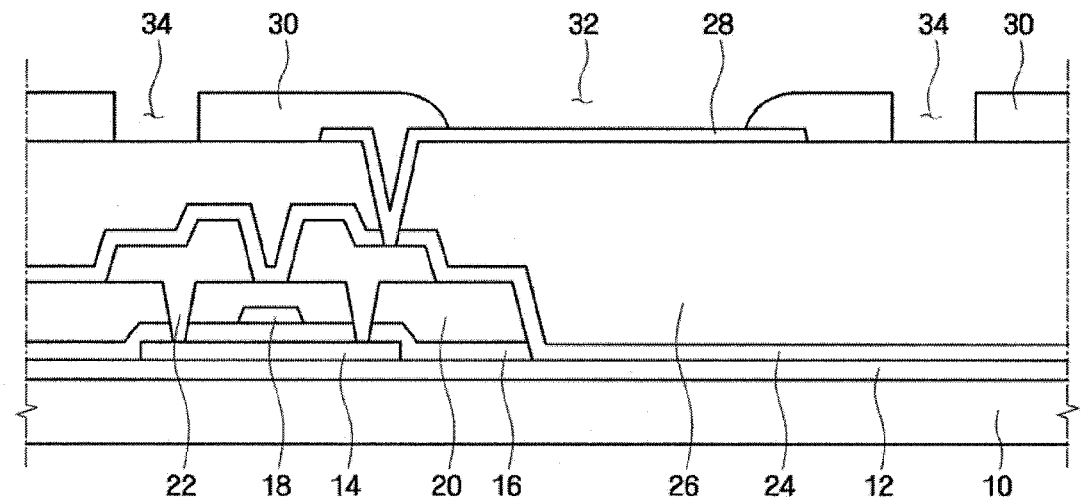
FIG. 1 is a cross-sectional view of an organic light-emitting display device according to an embodiment of the present invention.

Advantages and features of the present invention and methods of accomplishing the same may be understood more readily by reference to the following detailed description of embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, sizes and relative sizes of layers and regions may be exaggerated for clarity.

It will be understood that when an element or layer is referred to as being "on" another element or layer, the element or layer can be directly on another element or layer or intervening elements or layers may also be present. In contrast, when an element is referred to as being "directly on" another element or layer, there are no intervening elements or layers present. As used herein, the term "and/or" includes any and all combinations of one or more of the associated listed items.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures.

Embodiments of the invention are described herein with reference to plan and cross-section illustrations that are schematic illustrations of embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

Hereinafter, embodiments of the present invention will be described in further detail with reference to the accompanying drawings.

Figure 2:
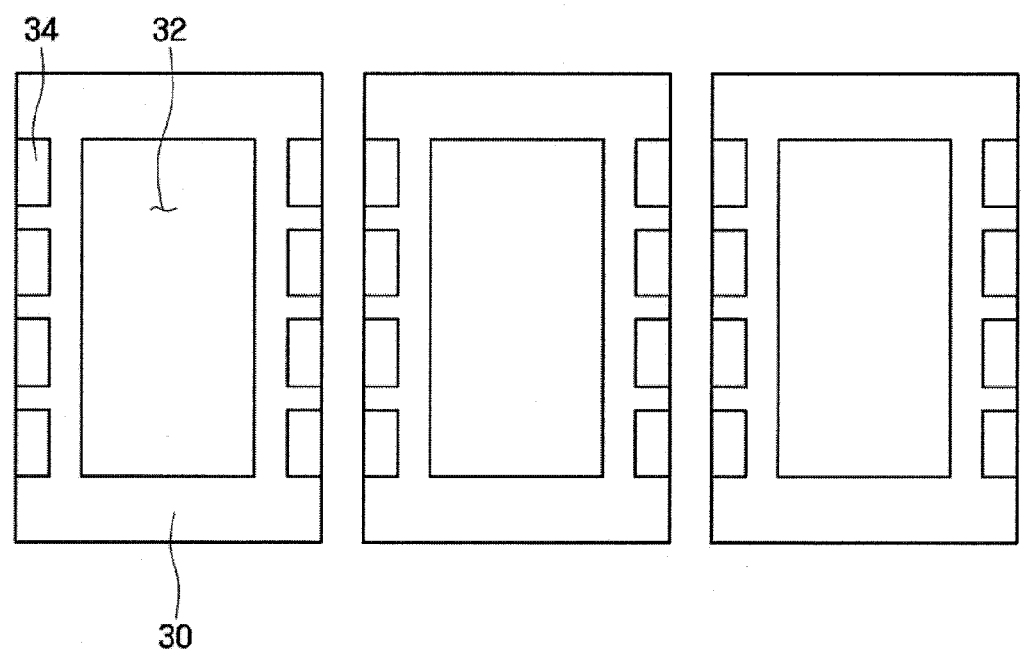
FIG. 2 is a plan view of the organic light-emitting display device shown in FIG. 1.
Figure 3:
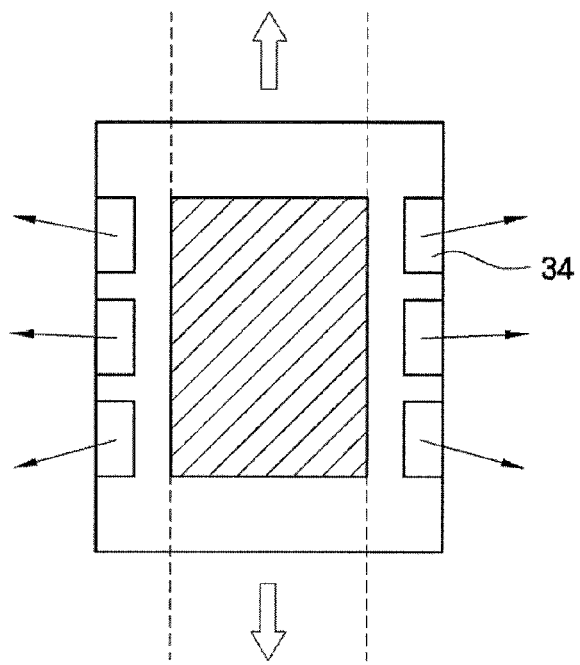
FIG. 3 is a diagram illustrating a process of forming an organic light-emitting layer in the organic light-emitting display device of FIG. 2 by using a nozzle printing method.

An embodiment of the present invention will now be described with reference to FIGS. 1 through 3. FIG. 1 is a cross-sectional view of an organic light-emitting display device according to an embodiment of the present invention. FIG. 2 is a plan view of the organic light-emitting display device shown in FIG. 1. FIG. 3 is a diagram illustrating a process of forming an organic light-emitting layer in the organic light-emitting display device of FIG. 2 by using a nozzle printing method.

The organic light-emitting display device according to an embodiment of the present invention includes a substrate 10, a buffer layer 12 which is disposed on the substrate 10, a semiconductor layer 14 which is disposed on the buffer layer 12 of a transistor region of the substrate 10, a gate electrode 18 which is insulated from the semiconductor layer 14, a gate insulating film 16 which insulates the semiconductor layer 14 from the gate electrode 18, a source/drain electrode 22 which is insulated from the gate electrode 18 and is electrically connected to the semiconductor layer 14 by a contact hole, a planarization film 26 which is disposed on the source/drain electrode 22, a first electrode 28 which is disposed on the planarization film 26 and is electrically connected to the source/drain electrode 22, and a pixel defining layer 30 which is formed on the first electrode 28 and includes an aperture 32 exposing a portion of the first electrode 28 to define a pixel region. In a region of the pixel defining layer 30 other than the aperture 32, an outgassing hole 34 is formed to expose the planarization film 26.

The substrate 10 may be made of a transparent glass material containing $SiO_2$ as a main component. However, the material that forms the substrate 10 is not limited to the transparent glass material. The substrate 10 may also be made of a transparent plastic material that may be an insulating organic material selected from the group consisting of polyethersulphone (PES), polyacrylate (PAR), polyetherimide (PEI), polyethylene napthalate (PEN), polyethylene terephthalate (PET), polyphenylene sulfide (PPS), polyallylate, polyimide, polycarbonate (PC), cellulose triacetate (TAC), and cellulose acetate propionate (CAP).

In a case where the organic light-emitting display device is a bottom emission organic light-emitting display device in which an image is realized toward the substrate 10, the substrate 10 should be made of a transparent material. However, in a case where the organic light-emitting display device is a top emission organic light-emitting display device in which an image is realized away from the substrate 10, the substrate 10 may not necessarily be made of a transparent material. In this case, the substrate 10 may be made of metal. When the substrate 10 is made of metal, the substrate 10 may include at least one material selected from the group consisting of carbon, iron, chrome, manganese, nickel, titanium, molybdenum, and stainless steel (SUS). However, the material that forms the substrate 10 is not limited to the above materials. The substrate 10 may also be made of metal foil.

The buffer layer 12 may further be formed on the substrate 10 to planarize the substrate 10 and prevent penetration of impurities into the substrate 10. The buffer layer 12 may be a single layer of SiOx, SiNx or SiO2Nx, or a multilayer of these materials.

The semiconductor layer 14 is formed on the buffer layer 12. The semiconductor layer 14 may be made of silicon (Si), i.e., amorphous silicon (a-Si). Alternatively, the semiconductor layer 14 may be made of polycrystalline silicon (p-Si). Otherwise, the semiconductor layer 14 may be made of, but is not limited to, Ge, GaP, GaAs, or AlAs. The semiconductor layer 14 may be a silicon semiconductor layer formed by lightly diffused n-type impurities of a silicon-on-insulator (SOI) substrate. Alternatively, the semiconductor layer 14 may be formed by doping a portion of amorphous silicon with P-type or N-type impurities.

The gate insulating film 16 is disposed on the semiconductor layer 14 to cover the semiconductor layer 14 and insulates the semiconductor layer 14 and the gate electrode 18 from each other. Like the buffer layer 12, the gate insulating film 16 may be a single layer of SiO2, SiNx or SiO2Nx, or a multilayer of these materials. The gate insulating film 16 may be made of the same material as the buffer layer 12 or of a different material from that of the buffer layer 12.

The gate electrode 18 is formed on the gate insulating film 16. The gate electrode 18 transmits a gate signal to control the light-emitting operation of each pixel. The gate electrode 18 may be a single layer of an Al alloy, such as Al, Cr—Al, Mo—Al or Al—Nd, or a multilayer of a Cr or Mo alloy and an Al alloy stacked on the Cr or Mo alloy.

An interlayer insulating film 20 is formed on the gate electrode 18. The interlayer insulating film 20 electrically insulates the gate electrode 18 from the source/drain electrode 22. Like the buffer layer 12, the interlayer insulating film 20 may be a single layer of SiO2, SiNx or SiO2Nx, or a multilayer of these materials.

The source/drain electrode 22 is formed on the interlayer insulating film 20 and is electrically connected to the semiconductor layer 14. The source/drain electrode 22 may be made of any one material selected from Mo, Cr, W, MoW, Al, Al—Nd, Ti, TiN, Cu, a Mo alloy, an Al alloy, and a Cu alloy. The source/drain electrode 22 is electrically connected to the first electrode 28 by the semiconductor layer 14 via a contact hole and thus applies a voltage to the first electrode 28.

An additional insulating film 24 may be provided on the source/drain electrode 22, and the planarization film 26 is provided on the insulating film 24 to planarize the substrate 10. When a panel is manufactured using the nozzle printing method, it is important to ensure the flatness of the substrate 10. Therefore, the planarization film 26 is used to maintain the flatness of the substrate 10 at a predetermined level. The planarization film 26 may be made of an organic acrylic material.

The first electrode 28 is disposed on the planarization film 26 and is electrically connected to the source/drain electrode 22. The first electrode 28 and the source/drain electrode 22 may be connected to each other by a contact hole that penetrates the insulating film 24 and the planarization film 26. Therefore, as described above, a driving voltage may be applied from the source/drain electrode 22 to the first electrode 28.

The first electrode 28 may be made of one or more transparent conductive materials selected from indium tin oxide (ITO), indium zinc oxide (IZO), carbon nanotubes, a conductive polymer, and nanowires. That is, the first electrode 28 may be made of a mixture of one or more of the transparent conductive materials.

The pixel defining layer 30 defining the pixel region may be formed on the first electrode 28. The pixel defining layer 30 is formed on the entire surface of the substrate 10 to cover the planarization film 26. The aperture 32 exposing a portion of the first electrode 28 is formed in the pixel defining layer 30 to define the pixel region. The pixel defining layer 30 may be a single layer of an inorganic material, such as SiO2, SiNx or SiO2Nx, or may be a multilayer of these materials.

Since the planarization film 26 is made of an organic material as described above, outgassing may be generated during a baking process that accompanies a nozzle printing process. However, the pixel defining layer 30 formed on the planarization film 26 prevents the outgassing from being released from the planarization film 26.

To allow the outgassing generated during the baking process to be released from the planarization film 26, the outgassing hole 34 is formed in the pixel defining layer 30 according to an embodiment. The outgassing hole 43 may be formed in a plurality. Here, the outgassing holes 34 may be arranged at predetermined intervals along a direction that is parallel to at least a surface of the pixel region.

That is, as shown in FIG. 2, when the aperture 32 is rectangular, the pixel region defined by the rectangular aperture 32 may also be rectangular. In this case, a plurality of outgassing holes 34 may be formed along at least one edge (in a vertical direction in FIG. 2) of the pixel region.

As described above, the outgassing hole 34 formed in the pixel defining layer 30 to expose an upper surface of the planarization film 26 allows outgassing generated by the organic planarization film 26 during a baking process to be released from the planarization film 26. Accordingly, the internal pressure of the planarization film 26 can be reduced, and a corresponding pixel can be prevented from being defective due to the lifting off from the planarization film 26 by the first electrode 28 or the pixel defining layer 30.

Referring to FIG. 3, when an organic light-emitting layer 36 is formed on the portion of the fist electrode 28, which is exposed by the aperture 32, using the nozzle printing method, a nozzle sprays an organic light-emitting material while shuttling along a direction indicated by arrows. If the outgassing hole 34 is formed on a path along which the nozzle moves, it may affect the thickness uniformity of the organic light-emitting layer 36 being printed. Therefore, the outgassing hole 34 may be formed in a region other than the path along which the nozzle moves during nozzle printing.

The organic light-emitting display device according to an embodiment may further include the organic light-emitting layer 36 formed on the first electrode 28 of the pixel region by nozzle printing and a second electrode 38 formed on the organic light-emitting layer 36.

Hereinafter, a method of manufacturing an organic light-emitting display device according to an embodiment of the present invention will be described with reference to FIGS. 4 through 12. FIGS. 4 through 12 are views sequentially illustrating a method of manufacturing an organic light-emitting display device according to an embodiment of the present invention.

The method of manufacturing an organic light-emitting display device according to an embodiment includes forming a buffer layer on a substrate, forming a semiconductor layer on the buffer layer of a transistor region of the substrate, forming a gate electrode film on the semiconductor layer, forming a gate electrode on the gate insulating film, forming a source/drain electrode which is insulated from the gate electrode and is electrically connected to the semiconductor layer by a contact hole, forming a planarization film on the source/drain electrode, forming a first electrode, which is electrically connected to the source/drain electrode, on the planarization film, providing a pixel defining layer which includes an aperture exposing a portion of the first electrode to define a pixel region, forming an outgassing hole in a region of the pixel defining layer other than the aperture to expose the planarization film, and forming an organic light-emitting layer on the first electrode of the pixel region by using a nozzle printing method. Outgassing generated by the planarization film in the forming of the organic light-emitting layer is released from the planarization film through the outgassing hole.

Figure 4:
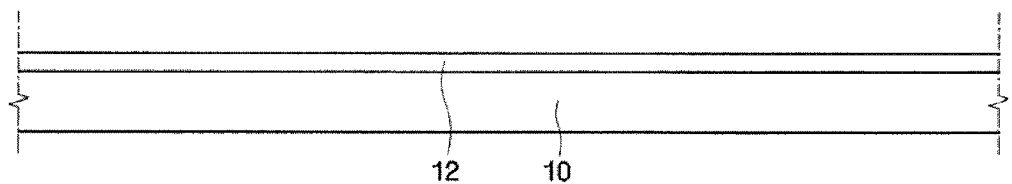
FIGS. 4 through 12 are views sequentially illustrating a method of manufacturing an organic light-emitting display device according to an embodiment of the present invention.

Referring to FIG. 4, a substrate 10 is provided, and a buffer layer 12 is formed on the substrate 10. A pixel region and a transistor region can be defined arbitrarily. The pixel region is a region which actually generates light due to an organic light-emitting layer formed therein. The transistor region is a region in which a thin-film transistor (TFT) including a gate electrode, a source/drain electrode, and a semiconductor layer is formed to apply a driving voltage to the organic light-emitting layer of the pixel region. The types of the substrate 10 that can be used are as described above. The buffer layer 12 is formed on the substrate 10 to planarize the substrate 10 and prevent penetration of impurities into the substrate 10.

Figure 5:
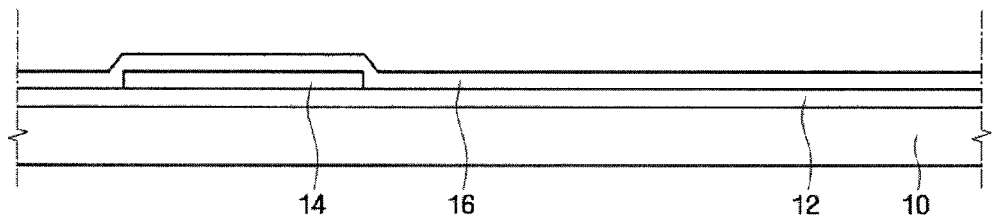

Referring to FIG. 5, a semiconductor layer 14 is formed on the buffer layer 12, and a gate insulating film 16 is formed on the semiconductor layer 14. As described above, the semiconductor layer 14 is formed in the transistor region in order to constitute a TFT.

Figure 6:
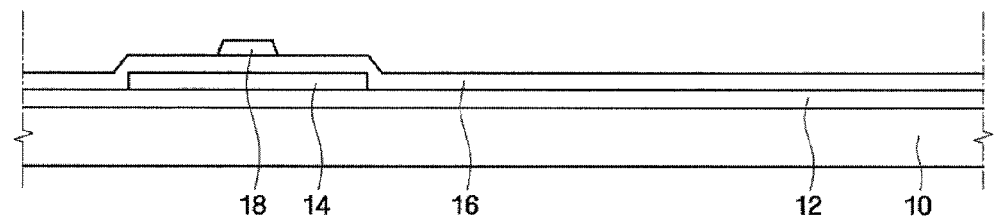

Referring to FIG. 6, a gate electrode 18 electrically insulated from the semiconductor layer 14 is formed on the gate insulating film 16. As described above, the gate electrode 18 may be a single metal layer or a stack of a plurality of metal layers.

Figure 7:
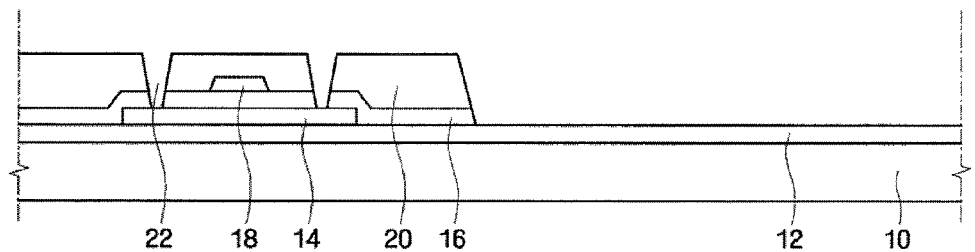

Referring to FIG. 7, an interlayer insulating film 20 is formed on the gate electrode 18. The interlayer insulating film 20 electrically insulates the gate electrode 18 from a source/drain electrode 22. The interlayer insulating film 20 may be formed on the entire surface of the substrate 10. Then, the interlayer insulating film 20 in a region other than the transistor region may be removed. In addition, a contact hole is formed to connect the source/drain electrode 22 to the semiconductor layer 14.

Figure 8:
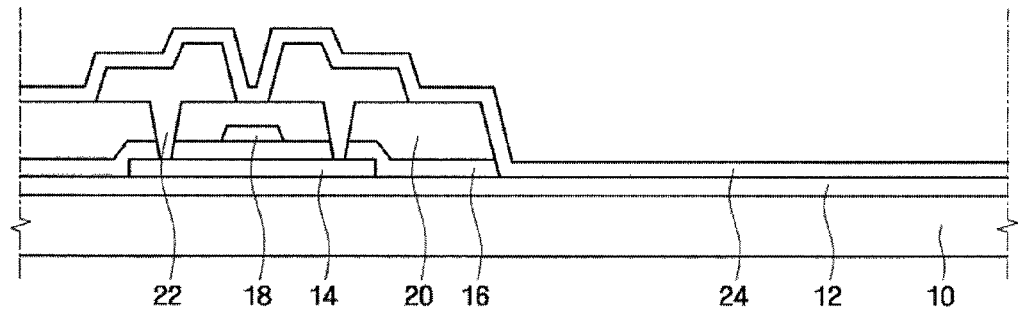

Referring to FIG. 8, the source/drain electrode 22 is formed to be electrically connected to the semiconductor layer 14, and an additional insulating film 24 may further be provided on the source/drain electrode 22. Accordingly, a TFT including the semiconductor layer 14, the gate electrode 18, and the source/drain electrode 22 is completed.

Figure 9:
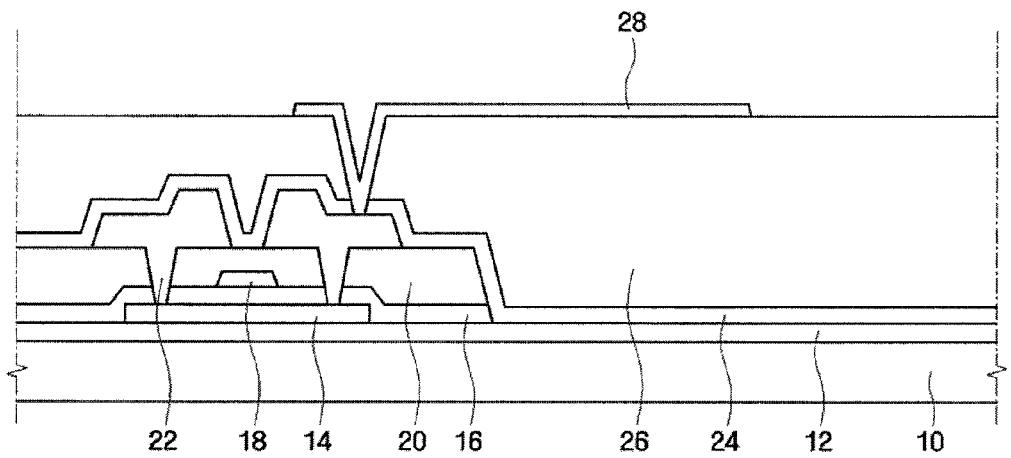

Referring to FIG. 9, a planarization film 26 is formed on the entire surface of the substrate 10. As described above, the planarization film 26 may be made of one or more organic acrylic materials and improves the flatness of the substrate 10. A contact hole is formed at a location, which corresponds to the source/drain electrode 22, in the planarization film 26, and a first electrode 28 connected to the source/drain electrode 22 by the contact hole is formed. An end of the first electrode 28 is formed in the transistor region, and the other end of the first electrode 28 is formed in the pixel region.

Figure 10:
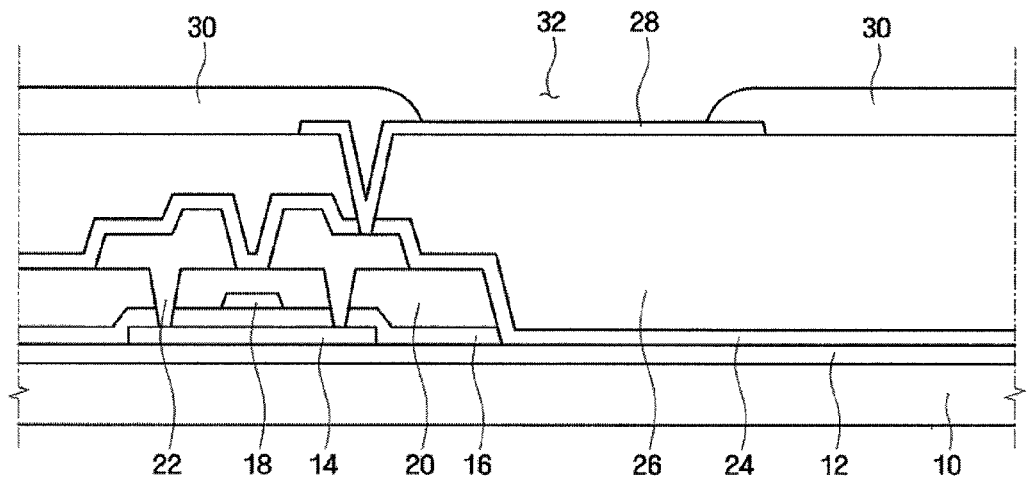

Referring to FIG. 10, a pixel defining layer 30 is formed on the first electrode 28. The pixel defining layer 30 is made of an inorganic material. An aperture 32 exposing partly or entirely the first electrode 28 is formed in the pixel defining layer 30 to define the pixel region.

Figure 11:
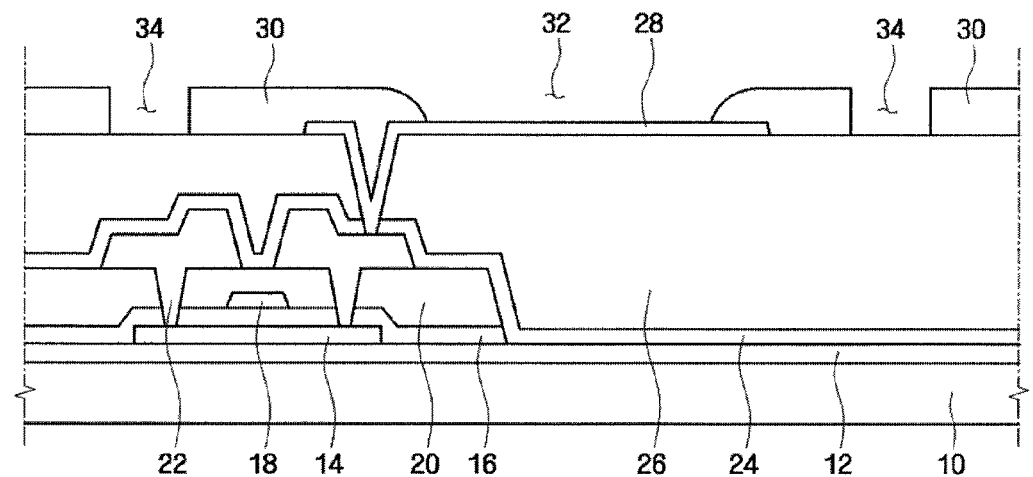

Referring to FIG. 11, an outgassing hole 34 exposing the planarization film 26 is formed in part of the pixel defining layer 30. As described above, the outgassing hole 34 may be formed in a plurality. Here, the outgassing holes 34 may be arranged at predetermined intervals along a direction that is parallel to at least one surface of the pixel region.

The outgassing hole 34 may be formed in the pixel defining layer 30 using various etching methods such as dry etching.

The outgassing hole 34 formed in the pixel defining layer 30 may have sharp edges as shown in the drawing. In particular, when dry etching is used to form the outgassing hole 34, the edges of the outgassing hole 34 may be sharp. Thus, a second electrode 38 formed on the outgassing hole 34 is highly likely to short-circuit or be damaged by the sharp edges of the outgassing hole 34. For this reason, after the outgassing hole 34 is formed, a process of rounding the edges of the outgassing hole 34 may be additionally performed. The rounding of the edges of the outgassing hole 34 can be achieved by an additional etching process.

Figure 12:
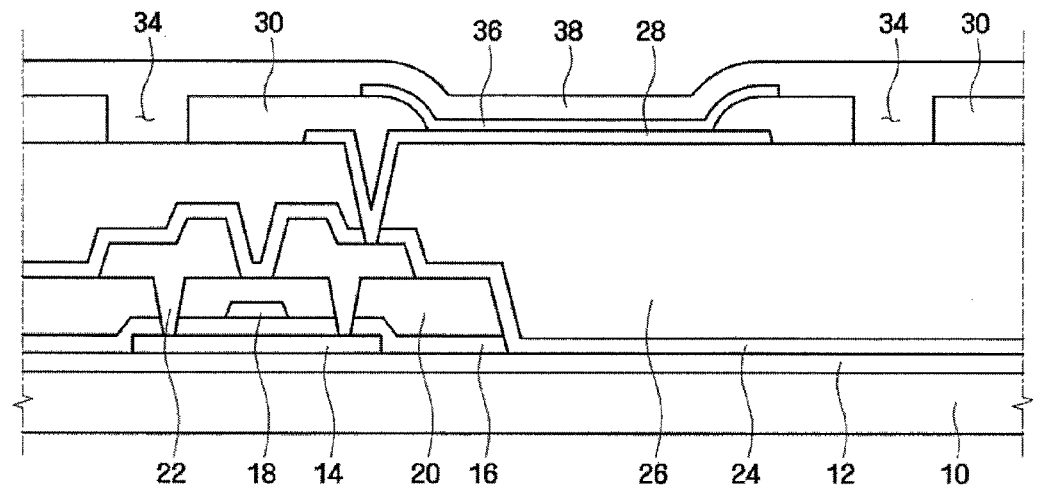

Referring to FIG. 12, an organic light-emitting layer 36 is provided on a portion of the first electrode 28 exposed by the aperture 32, and the second electrode 38 is formed on the organic light-emitting layer 36. As described above, the organic light-emitting layer 36 may be formed using the nozzle printing method. The organic light-emitting layer 36 provided between the first electrode 28 and the second electrode 38 emits light, thereby displaying desired image information.

When the organic light-emitting layer 36 is formed using the nozzle printing method, a baking process is repeatedly performed to remove a solvent and the like. Accordingly, outgassing is generated in the planarization film 26. Here, since the organic light-emitting display device manufactured using the method of manufacturing an organic light-emitting display device according to an embodiment includes the outgassing hole 34, the outgassing generated in the planarization film 26 can be released from the planarization film 26 through the outgassing hole 34, and thus deforming or damaging the planarization film 26 or a film stacked on the planarization film 26 can be minimized.

In addition, since the outgassing hole 34 is formed in a region other than a path along which a nozzle moves during nozzle printing, it does not affect the nozzle printing process of the organic light-emitting layer 36.

Figure 13:
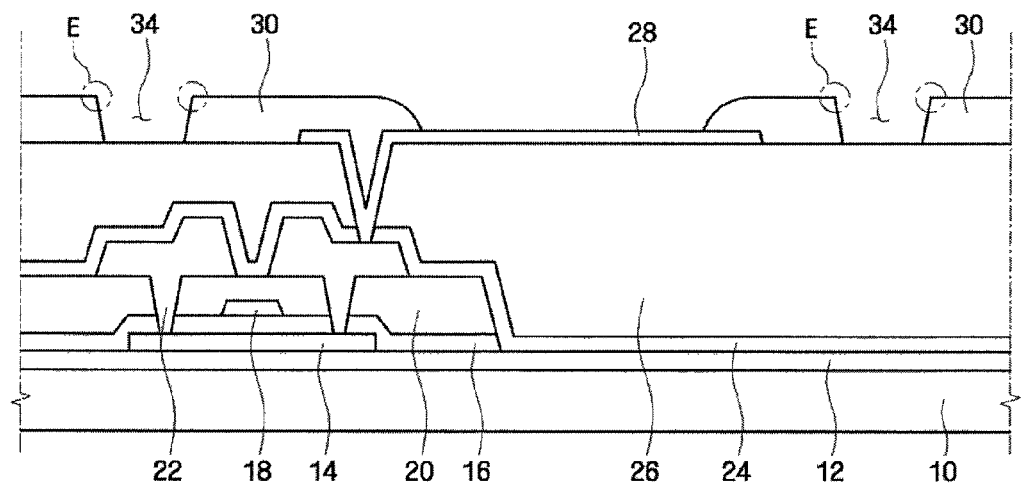
FIG. 13 is a partial cross-sectional view of an organic light-emitting display device according to another embodiment of the present invention.
Figure 14:
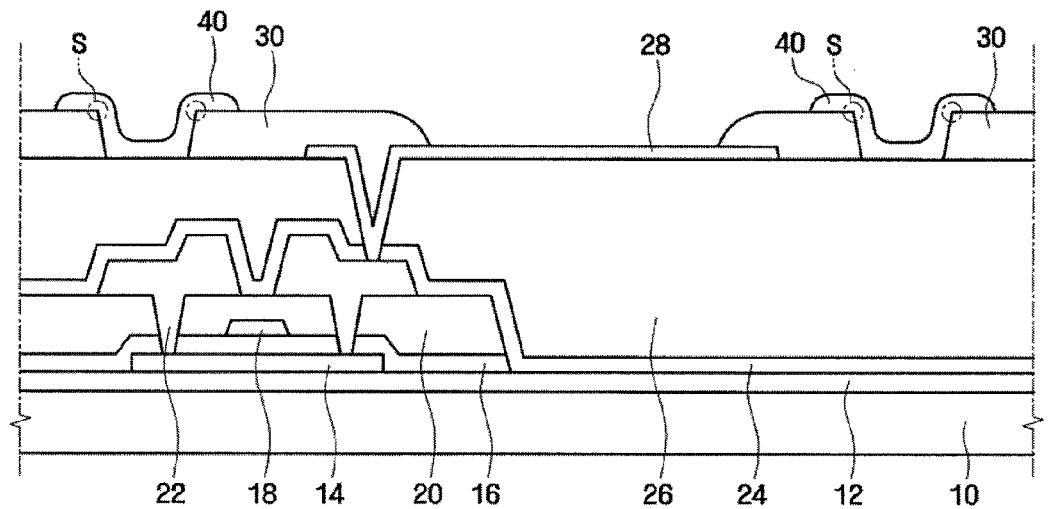
FIG. 14 is a cross-sectional view of an organic passivation film formed in the organic light-emitting display device of FIG. 13.

Hereinafter, an organic light-emitting display device according to another embodiment of the present invention will be described with reference to FIGS. 13 through 15. FIG. 13 is a partial cross-sectional view of an organic light-emitting display device according to another embodiment of the present invention. FIG. 14 is a cross-sectional view of an organic passivation film 40 formed in the organic light-emitting display device of FIG. 13.

The organic light-emitting display device according to an embodiment includes a substrate 10, a buffer layer 12 which is disposed on the substrate 10, a semiconductor layer 14 which is disposed on the buffer layer 12 of the transistor region, a gate electrode 18 which is insulated from the semiconductor layer 14, a gate insulating film 16 which insulates the semiconductor layer 14 from the gate electrode 18, a source/drain electrode 22 which is insulated from the gate electrode 18 and is electrically connected to the semiconductor layer 14 by a contact hole, a planarization film 26 which is disposed on the source/drain electrode 22, a first electrode 28 which is disposed on the planarization film 26 and is electrically connected to the source/drain electrode 22, and a pixel defining layer 30 which is formed on the first electrode 28 and includes an aperture 32 exposing a portion of the first electrode 28 to define a pixel region. In a region of the pixel defining layer 30 other than the aperture 32, an outgassing hole 34 is formed to expose the planarization film 26. The organic passivation film 40 is formed on the outgassing hole 34 to cover edges E of the outgassing hole 34.

The organic light-emitting display device according to an embodiment has the same configuration as the organic light-emitting display device according to the previous embodiment, except that the organic passivation film 40 covering the edges E of the outgassing hole 34 is further provided on the outgassing hole 34.

Referring to FIG. 13, when the outgassing hole 34 is formed by dry etching, it has the edges E which may cause, e.g., a second electrode 38 stacked on the outgassing hole 34 to short-circuit. Therefore, the edges E of the outgassing hole 34 may be rounded through an additional etching process. Alternatively, in an embodiment of the present invention, the organic passivation film 40 may further be formed to cover the edges E of the outgassing hole 34, as shown in FIG. 14. The organic passivation film 40 may be made of an organic material such as DL1000CR. Since the organic passivation film 40 covers sharp portions (such as the edges E) of the outgassing hole 34, it can prevent the second electrode 38 from short-circuiting. The organic passivation film 40 may be formed to cover all or part of the outgassing hole 34. The organic passivation film 40 may have a curved surface without sharpen edges.

Figure 15:
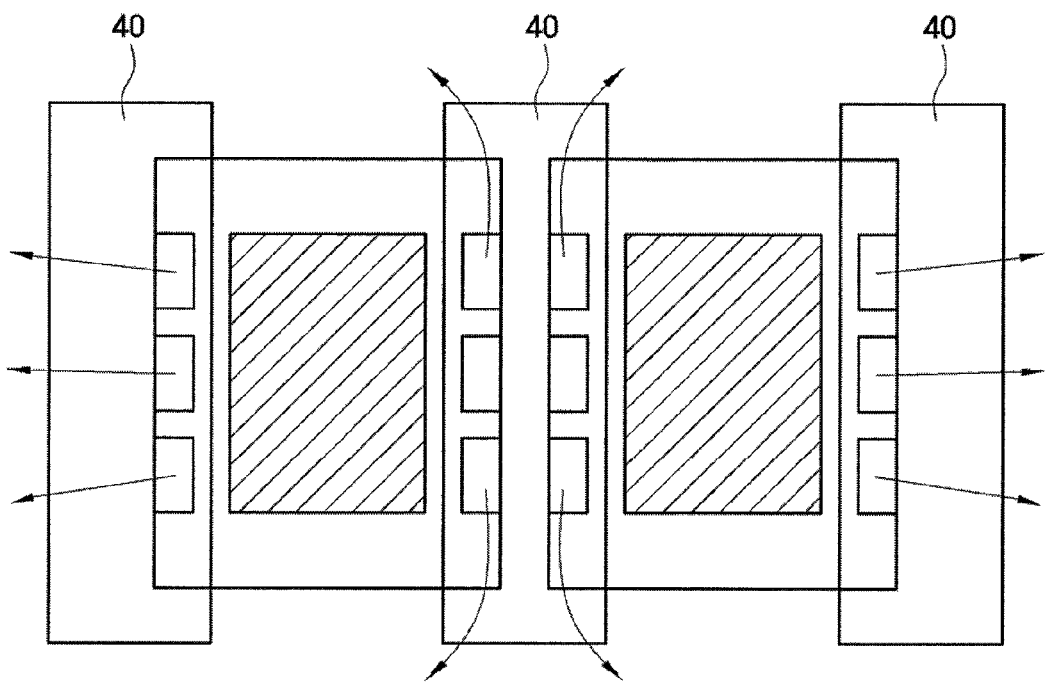
FIG. 15 is a plan view of the organic light-emitting display device shown in FIG. 13.

Referring to FIG. 15, like the planarization film 26, the organic passivation film 40 is made of an organic material. Therefore, even when the organic passivation film 40 covers the whole of the outgassing hole 34, it allows outgassing generated in the planarization film 26 to be released from the planarization film 26, unlike the pixel defining layer 30.

Figure 16:
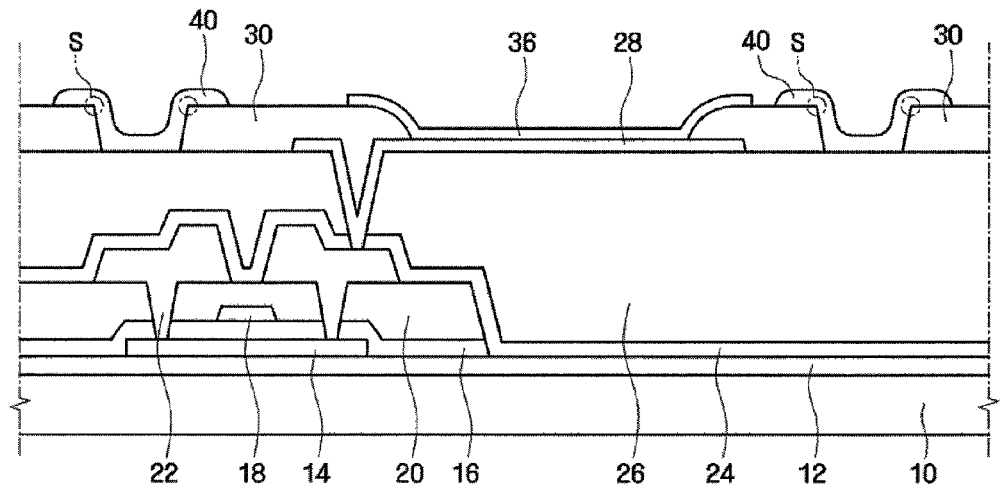
FIGS. 16 and 17 are views sequentially illustrating a method of manufacturing an organic light-emitting display device according to another embodiment of the present invention.
Figure 17:
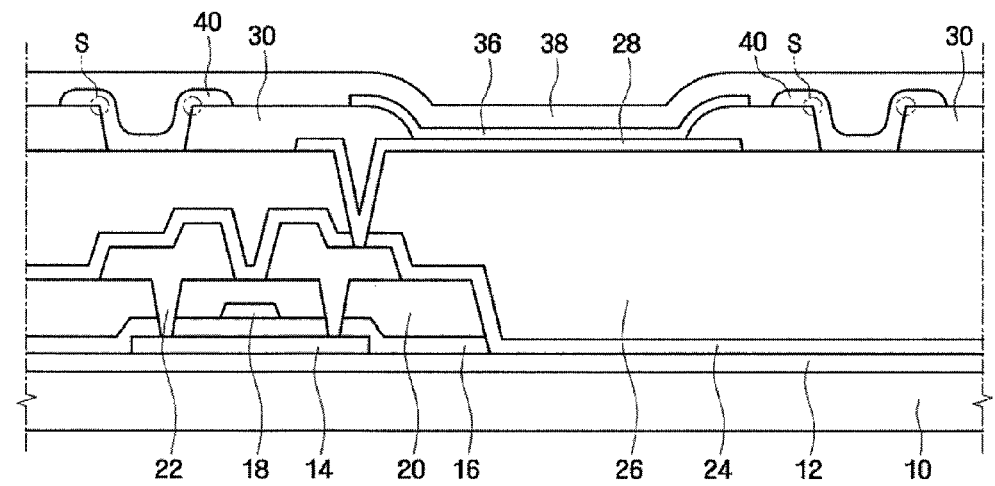

Hereinafter, a method of manufacturing an organic light-emitting display device according to another embodiment of the present invention will be described with reference to FIGS. 16 and 17. FIGS. 16 and 17 are views sequentially illustrating a method of manufacturing an organic light-emitting display device according to another embodiment of the present invention.

The method of manufacturing an organic light-emitting display device according to an embodiment includes forming a buffer layer on a substrate, forming a semiconductor layer on the buffer layer of a transistor region of the substrate, forming a gate electrode film on the semiconductor layer, forming a gate electrode on the gate insulating film, forming a source/drain electrode which is insulated from the gate electrode and is electrically connected to the semiconductor layer by a contact hole, forming a planarization film on the source/drain electrode, forming a first electrode, which is electrically connected to the source/drain electrode, on the planarization film, providing a pixel defining layer which includes an aperture exposing a portion of the first electrode to define a pixel region, forming an outgassing hole in a region of the pixel defining layer other than the aperture to expose the planarization film, forming an organic passivation film on the outgassing hole to cover edges of the outgassing hole, and forming an organic light-emitting layer on the first electrode of the pixel region by using a nozzle printing method. Outgassing generated by the planarization film in the forming of the organic light-emitting layer is released from the planarization film through the organic passivation film and the outgassing hole.

The other processes of the manufacturing method according to an embodiment are the same as those of the manufacturing method according to the foregoing embodiments, except that forming the organic passivation film, which covers the edges of the outgassing hole, on the outgassing hole is further performed after the forming of the outgassing hole.

Referring to FIGS. 16 and 17, an organic passivation film 40 may be made of an organic material such as DL1000CR. Since the organic passivation film 40 covers sharp portions (such as edges) of an outgassing hole 34, it can prevent, for example, a second electrode 38 from short-circuiting. The organic passivation film 40 may cover partly or entirely the outgassing hole 34. In addition, the organic passivation film 40 may have a curved surface without sharpen edges. Therefore, the edges of the outgassing hole 34 can be covered as indicated by reference character S.

As described above, like a planarization film 26, the organic passivation film 40 is made of an organic material. Therefore, even when the organic passivation film 40 covers the whole of the outgassing hole 34, it allows outgassing generated in the planarization film 26 to be released from the planarization film 26, unlike a pixel defining layer 30.

While embodiments of the present invention has been particularly shown and described, it will be understood by those of ordinary skill in the art that various changes in form and detail may be made therein without departing from the spirit and scope of the present invention as defined by the following claims. The embodiments should be considered in a descriptive sense only and not for purposes of limitation.

What is claimed is:

1. An organic light-emitting display device comprising:
a substrate comprising a transistor region; and
a thin-film transistor formed over the transistor region of the substrate and comprising a planarization film which is disposed over a source/drain electrode and a pixel defining layer which comprises an aperture exposing a portion of a first electrode electrically connected to the source/drain electrode and defining a pixel region,
wherein at least two outgassing holes are formed in a region of the pixel defining layer other than the aperture and only adjacent to each of a first edge and a second edge of the pixel region, and wherein an organic passivation film is formed on a selective area over the pixel defining layer to cover edges of the at least two outgassing holes,
wherein the first edge and the second edge face each other.

2. The display device of claim 1, wherein the at least two outgassing holes comprise a plurality of outgassing holes.

3. The display device of claim 2, wherein the plurality of outgassing holes are arranged at predetermined intervals along a direction that is parallel to the first or second edge of the pixel region.

4. The display device of claim 1, wherein edges of the at least two outgassing holes are rounded.

5. The display device of claim 1, wherein the first electrode is made of a material containing one or more of ITO and IZO.

6. The display device of claim 1, further comprising:
an organic light-emitting layer formed over the first electrode of the pixel region; and
a second electrode formed over the organic light-emitting layer.

7. The display device of claim 1, wherein the organic passivation film has a curved surface.

* * * * *